(12) United States Patent
Liu

(10) Patent No.: US 8,610,200 B2
(45) Date of Patent: Dec. 17, 2013

(54) NITRIDE READ ONLY MEMORY DEVICE WITH BURIED DIFFUSION SPACERS AND METHOD FOR MAKING THE SAME

(75) Inventor: Chien Hung Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 44 days.

(21) Appl. No.: 13/094,271

(22) Filed: Apr. 26, 2011

(65) Prior Publication Data

US 2011/0198686 A1    Aug. 18, 2011

Related U.S. Application Data

(60) Continuation of application No. 12/479,817, filed on Jun. 7, 2009, now Pat. No. 8,008,156, which is a division of application No. 11/250,959, filed on Oct. 14, 2005, now abandoned.

(51) Int. Cl.
*H01L 29/792* (2006.01)
*H01L 29/66* (2006.01)
*H01L 29/786* (2006.01)
*H01L 21/336* (2006.01)

(52) U.S. Cl.
USPC ............ 257/326; 257/335; 257/349; 438/287

(58) Field of Classification Search
USPC ......... 438/257, 201, 211, 199, 287, 261, 264; 257/324, 314, 315, 326, 304, 305, 300, 257/298, 335, 349
See application file for complete search history.

(56) References Cited

U.S. PATENT DOCUMENTS

| | | | |
|---|---|---|---|
| 5,641,696 A | 6/1997 | Takeuchi | |
| 5,966,603 A | 10/1999 | Eitan | |
| 6,197,639 B1 | 3/2001 | Lee et al. | |
| 6,376,341 B1 | 4/2002 | Kluth et al. | |
| 6,461,916 B1 | 10/2002 | Adachi et al. | |
| 6,649,971 B1 | 11/2003 | Yeh et al. | |
| 6,744,675 B1 | 6/2004 | Zheng et al. | |
| 6,746,906 B2 * | 6/2004 | Rabkin et al. | 438/199 |
| 6,917,072 B2 * | 7/2005 | Noguchi et al. | 257/324 |
| 7,208,371 B2 | 4/2007 | Jung | |
| 7,301,219 B2 * | 11/2007 | Hsu et al. | 257/547 |
| 7,994,004 B2 * | 8/2011 | Harari | 438/266 |
| 2002/0028541 A1 | 3/2002 | Lee et al. | |

(Continued)

FOREIGN PATENT DOCUMENTS

| | | |
|---|---|---|
| CN | 1419282 A | 5/2003 |
| CN | 1476081 A | 2/2004 |

*Primary Examiner* — Walter H Swanson
*Assistant Examiner* — Wilner Jean Baptiste
(74) *Attorney, Agent, or Firm* — Stout, Uxa, Buyan & Mullins, LLP

(57) ABSTRACT

A method for making a nitride read only memory device with buried diffusion spacers is disclosed. An oxide-nitride-oxide (ONO) layer is formed on top of a silicon substrate, and a polysilicon gate is formed over the ONO layer. The polysilicon gate is formed less than a length of the ONO layer. Two buried diffusion spacers are formed beside two sidewalls of the polysilicon gate and over the ONO layer. Two buried diffusion regions are implanted on the silicon substrate next to the two buried diffusion spacers. The two buried diffusion regions are then annealed such that the approximate interfaces of the buried diffusion regions are under the sidewalls of the polysilicon gate. The structure of a nitride read only memory device with buried diffusion spacers is also described.

18 Claims, 7 Drawing Sheets

(56) References Cited

U.S. PATENT DOCUMENTS

| | | |
|---|---|---|
| 2002/0086548 A1 | 7/2002 | Chang |
| 2003/0011017 A1* | 1/2003 | Lee et al. ............... 257/314 |
| 2004/0002182 A1* | 1/2004 | Lai ............... 438/142 |
| 2004/0094793 A1 | 5/2004 | Noguchi et al. |
| 2004/0262668 A1 | 12/2004 | Wang |
| 2005/0012142 A1* | 1/2005 | Hazama et al. ............... 257/326 |
| 2005/0142758 A1* | 6/2005 | Jung ............... 438/258 |
| 2005/0215002 A1* | 9/2005 | Violette ............... 438/222 |
| 2007/0187749 A1* | 8/2007 | Sugimae et al. ............... 257/316 |
| 2009/0146146 A1 | 6/2009 | Knoefler et al. |

* cited by examiner

NITRIDE READ ONLY MEMORY DEVICE WITH BURIED DIFFUSION SPACERS AND METHOD FOR MAKING THE SAME

CROSS-REFERENCE TO RELATED APPLICATIONS

This application is a continuation of U.S. application Ser. No. 12/479,817, filed on Jun. 7, 2009 and entitled NITRIDE READ ONLY MEMORY DEVICE WITH BURIED DIFFUSION SPACERS AND METHOD FOR MAKING THE SAME, which is a divisional of U.S. application Ser. No. 11/250,959, filed on Oct. 14, 2005 and entitled NITRIDE READ ONLY MEMORY DEVICE WITH BURIED DIFFUSION SPACERS AND METHOD FOR MAKING THE SAME, the entire contents both of which are incorporated herein by reference.

BACKGROUND OF THE INVENTION

1. Field of the Invention

The present invention relates generally to a semiconductor memory device, and more particularly, to a nitride read only memory device with buried diffusion spacers and a method for making such a device.

2. Description of Related Art

As is well known in the art, a nitride read only memory device has an oxide-nitride-oxide (ONO) layer disposed over its silicon substrate. A polysilicon gate is disposed over the ONO layer. Two buried diffusion (BD) regions are implanted on the silicon substrate and are positioned adjacent to sidewalls of the polysilicon gate. Functioning as a source and a drain for the nitride read only memory device, the two BD regions are implanted through an ion implantation process. A channel is formed at the silicon substrate underneath the ONO layer and between the two BD regions.

During the fabrication process, the increase of thermal budget will improve the reliability of the nitride read only memory device. However, the increase of thermal budget can also make the nitride read only memory device to be prone to the short channel effect. In addition, the scaling of the nitride read only memory device can also induce the short channel effect. One way to prevent the occurrence of the short channel effect for this nitride read only memory device is to implant two pocket implant regions at each end of the channel with each pocket implant region adjacent to one of the BD regions. Nevertheless, because the two pocket implant regions are implanted at a tilt angle, the pocket implantation process will cause implant damages at the sidewalk of the polysilicon gate and the areas of the ONO layer that are close to where the charges are stored, which will jeopardize the reliability of the nitride read only memory device.

In view of the foregoing, there is a need for a nitride read only memory device and a fabrication method that will improve the reliability of the device and suppress the short channel effect.

SUMMARY OF THE INVENTION

Broadly speaking, the present invention fills this need by providing a nitride read only memory device with buried diffusion spacers. A method for making this device is also described.

In accordance with one aspect of the present invention, a nitride read only memory device with buried diffusion spacers is provided. This device includes a silicon substrate with two buried diffusion regions. An oxide-nitride-oxide (ONO) layer is formed on top of the silicon substrate. The two buried diffusion regions are covered by the ONO layer. A polysilicon gate is defined over portion of the ONO layer between the two buried diffusion regions such that each of the two sidewalls of the polysilicon gate is above an approximate interface of each of the two buried diffusion regions, respectively. Two buried diffusion spacers, i.e., two insulator spacers, are defined respectively beside the two sidewalls of the polysilicon gate and over the ONO layer. In one embodiment, each of the insulator spacers has a thickness of between about 100 angstroms to about 500 angstroms. In another embodiment, the insulator spacers are made of oxide.

In accordance with another aspect of the present invention, a method for making such a nitride read only memory device is described. In this method, a silicon substrate having an ONO layer formed thereon is provided. A polysilicon gate, with less than a length of the ONO layer, is formed over the ONO layer. Two buried diffusion spacers (insulator spacers) are formed beside the two sidewalls of the polysilicon gate and over the ONO layer. Next, two buried diffusion regions are implanted through the ONO layer on the silicon substrate next to the two insulator spacers. The two buried diffusion regions are then annealed such that the approximate interfaces of the buried diffusion regions are under the two sidewalls of the polysilicon gate. In one embodiment, the insulator spacers are formed by depositing a conformal insulator layer over the polysilicon gate and then etching off the portion of the conformal insulator layer on top of the polysilicon gate. In another embodiment, the two buried diffusion regions are annealed by a rapid thermal anneal process. In yet another embodiment, the two buried diffusion regions are implanted by a buried diffusion implantation process and a pocket implantation process.

Because of the insulator spacers are positioned beside the two sidewalls of the polysilicon gate, the implant damage, caused by a pocket implantation process, will only occur substantially under the insulator spacers on the ONO layer. Thus, the implant damage areas on the ONO layer are away from where the charges are stored. In addition, the polysilicon gate will not be affected by the pocket implantation process. As a result, the nitride read only memory device with buried diffusion spacers improves its reliability, suppresses the short channel effect, and has high potential for device scaling.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims.

Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
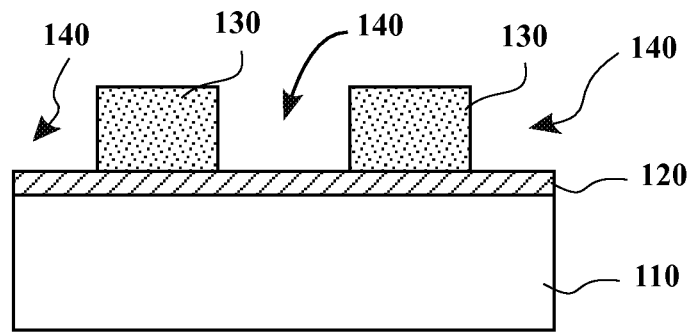
FIGS. 1(a)-1(d) illustrate an exemplary method for making two nitride read only memory devices with buried diffusion spacers in accordance with one embodiment of the present invention.

FIGS. 1(a)-1(d) illustrate an exemplary method for making two nitride read only memory devices with buried diffusion spacers in accordance with one embodiment of the present invention. With reference to FIG. 1(a), a silicon substrate 110 has an oxide-nitride-oxide (ONO) layer 120 formed thereon. A polysilicon layer, formed on top of the ONO layer 120, is patterned etched until the underling ONO layer 120 is exposed. As a result, three trenches 140 are formed. The remaining polysilicon layer forms two polysilicon gates 130 for the nitride read only memory devices.

Figure 1B:
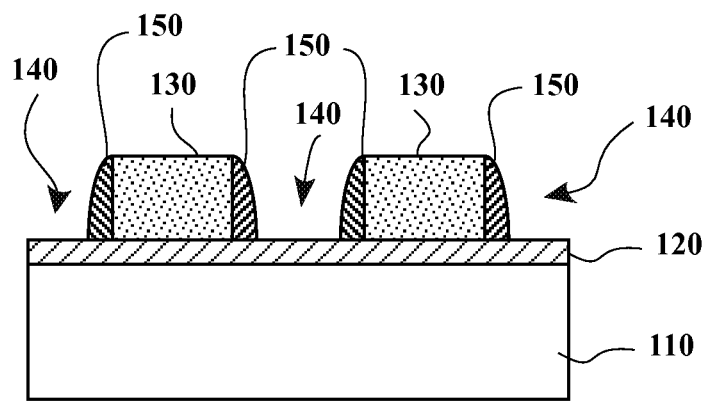

Next, as shown in FIG. 1(b), four buried diffusion (BD) spacers 150, i.e., four insulator spacers, are formed at sidewalls of the two polysilicon gates 130 by depositing a conformal layer of oxide over each of the two polysilicon gates 130 and etching off the portion of the conformal layer of oxide that is disposed on top of each of the two polysilicon gates 130.

Figure 1C:
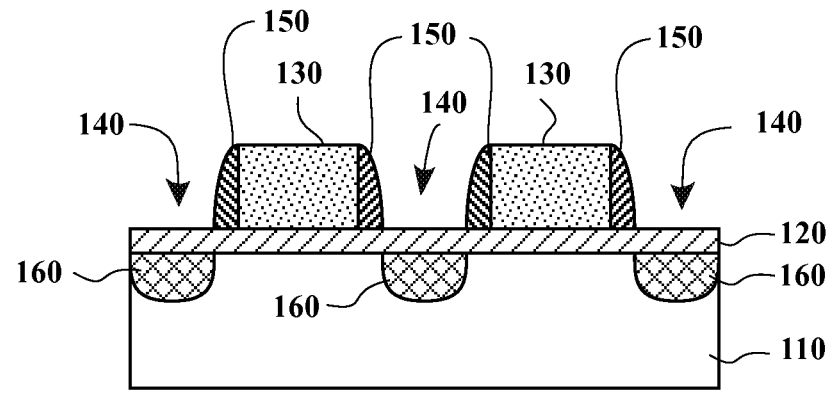

Turning to FIG. 1(c), an ion implantation process is performed to implant three BD regions 160 in the portions of the silicon substrate that are underneath the ONO layer 120 and below the three trenches 140. The ion implantation process includes a BD implantation process and a pocket it plantation process. As shown by the arrows in FIG. 1(c), the BD implantation is performed at angle that is perpendicular to the surface of the ONO layer 120, whereas the pocket implantation is performed at a tilt angle relative to the surface of the ONO layer 120. The tilt angle can range between about 0 degrees and about 60 degrees.

Figure 1D:
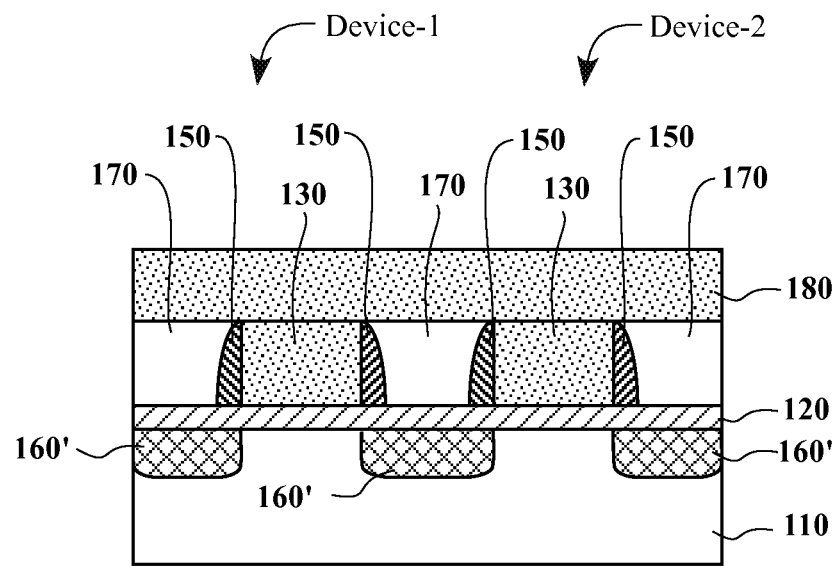

Continuing to FIG. 1(d), an annealing process is performed to drive-in the three BD regions 160 such that the approximate interfaces of the BD regions 160 are under the sidewalls of the polysilicon gates 130. Thus, three expanded BD regions 160 result in the drove-in BD regions 160'. As shown, three BD oxide regions 170 are formed over the ONO layer 120 to fill up the three trenches 140. Finally, a polysilicon layer 180 is deposited over the three BD oxide regions 170, the two polysilicon gates 130, and the four BD spacers 150. The polysilicon layer 180 is then patterned etched transversally to form a word line for the nitride read only memory devices. As shown in FIG. 1(d), two nitride read only memory devices are formed (device_1 and device_2).

Figure 2:
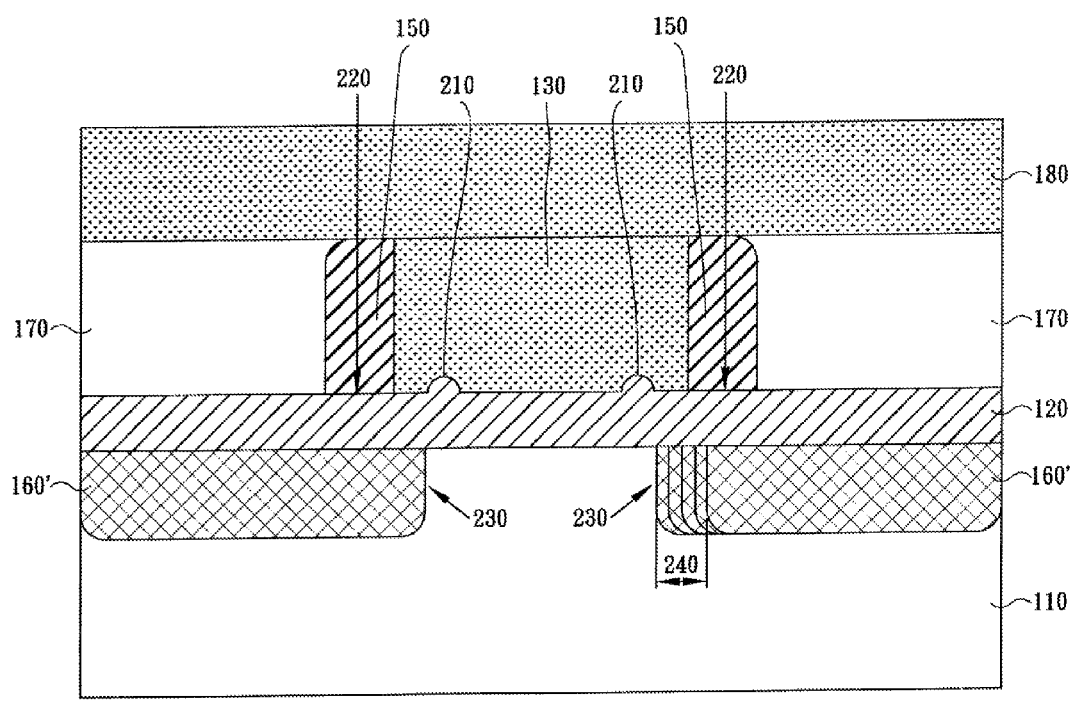
FIG. 2 illustrates a cross-sectional view of a nitride read only memory device with two diffusion spacers in accordance with one embodiment of the present invention.

FIG. 2 is a cross-sectional view of a nitride read only memory device with two BD spacers in accordance with one embodiment of the present invention. The nitride read only memory device has a silicon substrate 110 with two drove-in BD regions 160'. An ONO layer 120 is disposed over the silicon substrate 110. A polysilicon gate 130 is defined over the portion of the ONO layer 120 between the two drove-in BD regions 160'. Each of the two sidewalls of the polysilicon gate 130 is above an approximate interface 230 of each of the two drove-in BD regions 160'. Two BD spacers 150, i.e., two insulator spacers, are formed at each of the two sidewalls of the polysilicon gate 130. The thickness of each of the BD spacers ranges from between about 100 angstroms to 500 angstroms. As shown by the drove-in BD region interface range 240, the approximate interface 230 of each of the two drove-in BD regions 160' is located under one of the sidewalls of the polysilicon gate 130. Only one sidewall with the illustrated range 240 is shown, but it will be understood that the range applies to all of the interfaces 230. Two BD oxide regions 170 are formed beside each of the two BD spacers 150. A polysilicon layer 180 is defined over the two BD oxide regions 170, the two BD spacers 150, and the polysilicon gate 130. For the nitride read only memory device, the polysilicon layer 180 functions as a word line, and the two drove-in BD regions 160' function as source/drain regions, i.e., bit lines.

As shown, the nitride read only memory device is capable of storing charges 210 at the ONO layer 120 close to the approximate interfaces of the drove-in BD regions 160'. Because of the two BD spacers 150, the two implant damage areas 220, which are caused by a pocket implantation process, will occur at the ONO layer 120 substantially under the BD spacers 150. The polysilicon gate 130 will not be damaged by the pocket implantation process. As illustrated, the two implant damage areas 220 are away from where the charges 210 are stored, which improves the reliability of the nitride read only memory device and provides high potential for the nitride read only memory device scaling. Furthermore, the short channel effect is effectively suppressed.

Figure 3A:
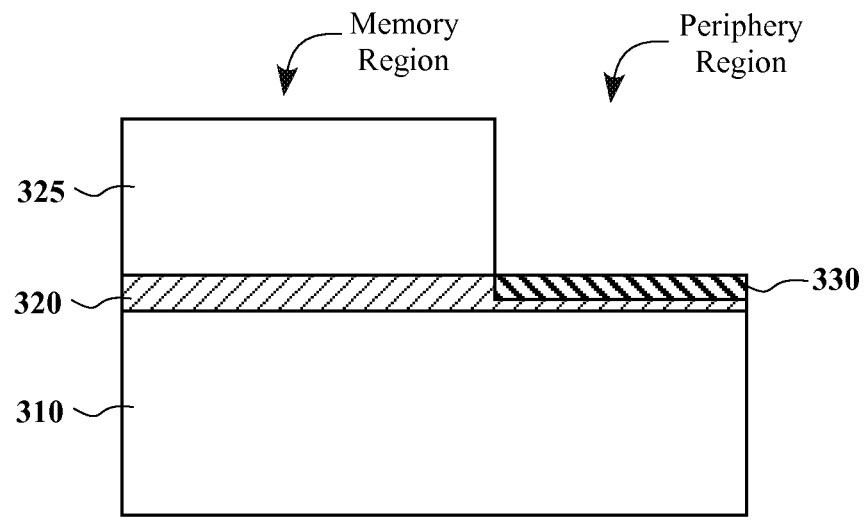
FIGS. 3(a)-3(g) illustrate an exemplary method for making nitride read only memory devices along with a periphery device in accordance with one embodiment of the present invention.

FIGS. 3(a)-3(g) illustrate an exemplary method for making nitride read only memory devices along with a periphery device in accordance with one embodiment of the present invention. As shown in FIG. 3(a), a silicon substrate 310 is divided into a memory region and a periphery region. A layer of ONO is formed on top of the silicon substrate 310 to cover the top surface of the silicon substrate 310 belonging to both the memory region and the periphery region. A photoresist 325 is deposited on top of the layer of ONO to block the portion of the layer of ONO belonging to the memory region. The layer of ONO is then patterned etched to remove the portion of the layer of ONO belonging to the periphery region. Thus, the remaining layer of ONO results in the ONO layer 320. A periphery gate oxide layer 330 is then deposited, next to the ONO layer 320 on top of the substrate belonging to the periphery region.

Figure 3B:
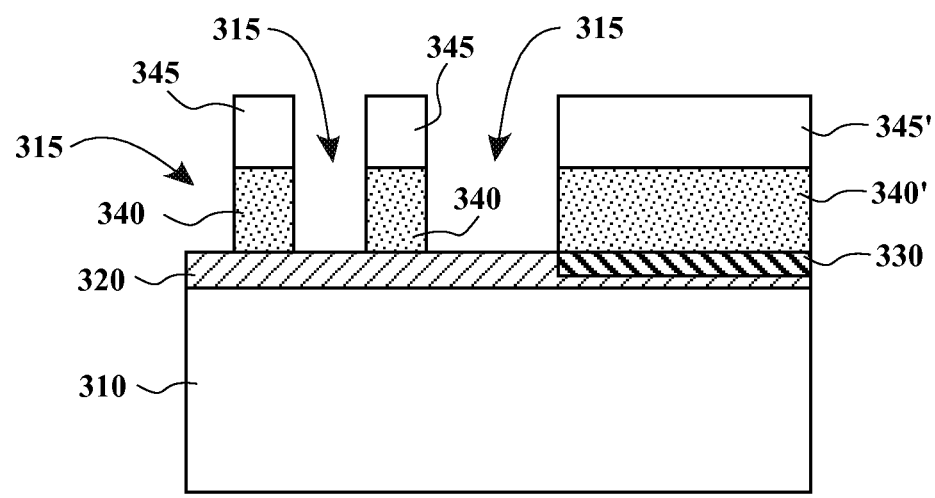

As shown in FIG. 3(b), after the photoresist 325 is removed, a layer of polysilicon is deposited on tops of the ONO layer 320 and the periphery gate oxide layer 330. The layer of polysilicon is patterned by photoresists 345 and 345', and then etched until the underling ONO layer 320 is exposed to form trenches 315. The portion of the layer of polysilicon belonging to the periphery region is not etched because of the blocking of the photoresist 345'. The remaining layer of polysilicon forms the polysilicon gates 340 and the polysilicon region 340'.

Figure 3C:
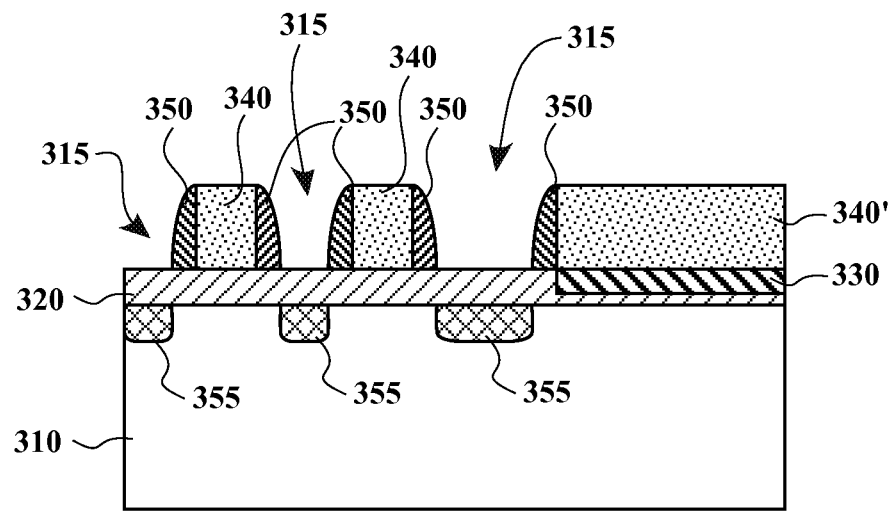

Referring to FIG. 3(c), after the photoresists 345 and 345' are removed, BD spacers 350 are formed on sidewalls of the polysilicon gates 340 and the polysilicon region 340'. Then, BD regions 355 are implanted on portions of the silicon substrate 310 that lie underneath the ONO layer 320 and below the trenches 315. The BD spacers 350 are formed by depositing a conformal layer of oxide over each of the polysilicon gates 340 and the polysilicon region 340', and then etching off the portion of the conformal layer of oxide that is disposed on top of each of the polysilicon gates 340 and the polysilicon region 340'. As indicated by the arrows, the BD regions 355 are formed by an ion implantation process that includes a BD implantation process and a pocket implantation process.

Figure 3D:
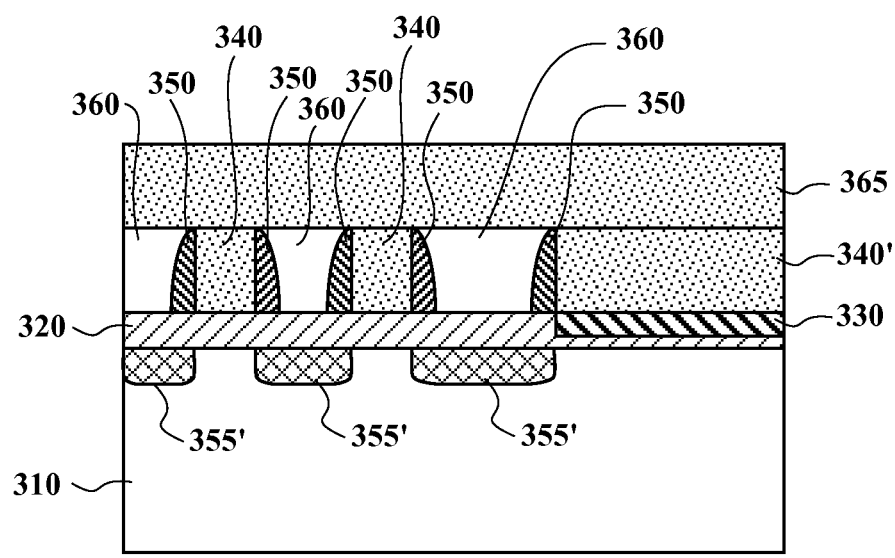

Continuing to FIG. 3(d), a furnace annealing process is performed to drive-in the BD regions 355 such that the approximate interfaces of the BD regions 355 are under the sidewalls of the polysilicon gates 340. Thus, the expanded BD regions 355 result in three drove-in BD regions 355'. Next, BD oxide regions 360 are formed over the ONO layer 320 to fill in the trenches 315. Finally, a polysilicon layer 365 is deposited over the BD oxide regions 360, the polysilicon gates 340, and the BD spacers 350.

Figure 3E:
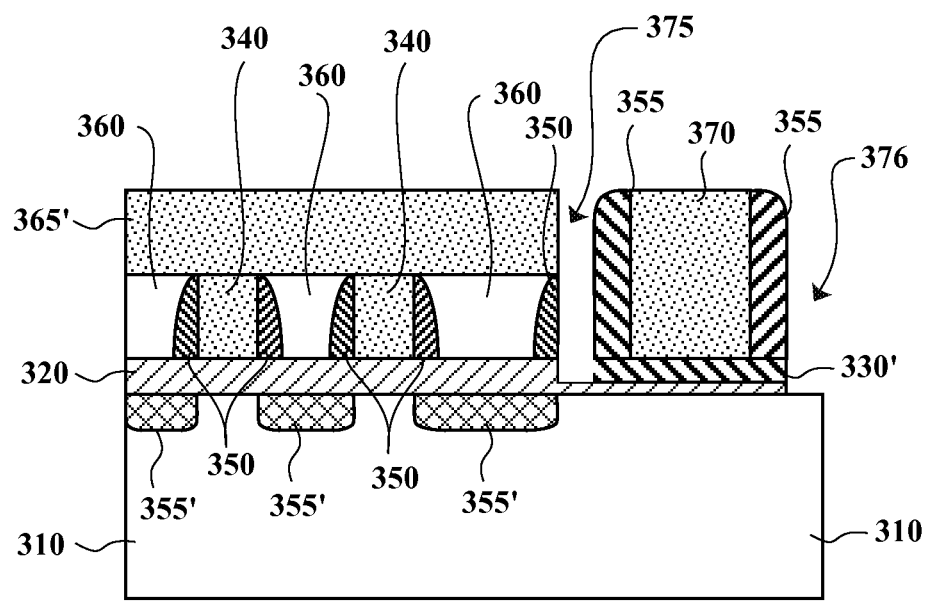

Turning to FIG. 3(e), a patterned etching process is performed to the polysilicon layer 365 to form transverse word lines 365' and two trenches 375 and 376 at the periphery region. The trenches 375 and 376 are formed in two steps: (1) Portions of the polysilicon layer 365 and the polysilicon region 340' are etched off, the remaining polysilicon layer 365 belonging to the periphery region and the remaining polysilicon region 340' form a periphery polysilicon gate 370; and (2) After two periphery insulator spacers 355 are formed at sidewalls of the periphery polysilicon gate 370, portions of the periphery gate oxide layer 330 which are not covered by the periphery polysilicon gate 370 and the two periphery insulator spacers 355 are etched off, resulting in the periphery gate oxide layer 330'. The two periphery insulator spacers 355 are formed by depositing an insulator layer over the periphery polysilicon gate 370 and etching off the portion of the insulator layer which lies on top of the periphery polysilicon gate 370. The thickness of each of the periphery insulator spacers ranges from between about 1500 angstroms to about 2500 angstroms.

Figure 3F:
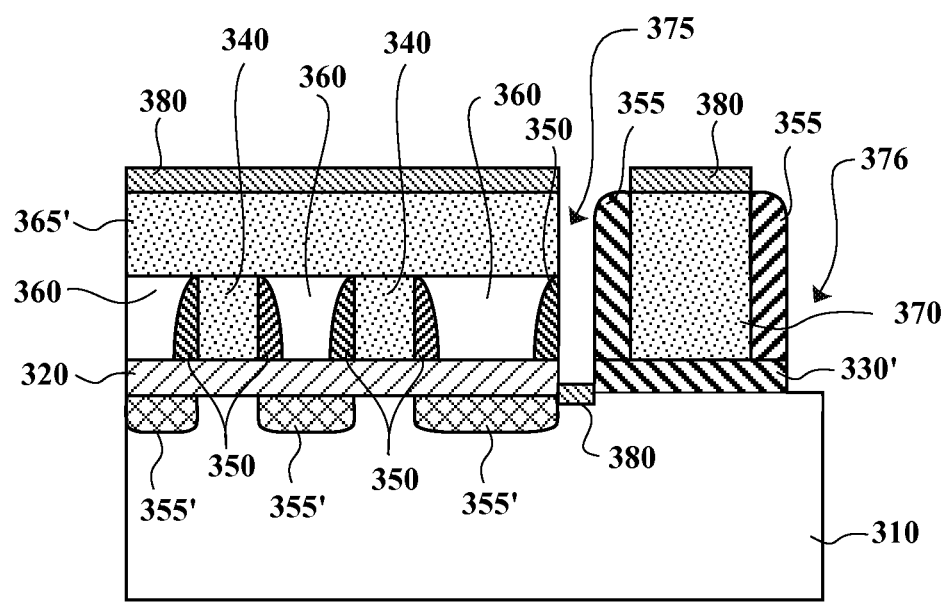

Continuing to FIG. 3(f), silicide layers 380 is formed at tops of the word line 365' and the periphery polysilicon gate 370, and at bottom of the trench 375.

Figure 3G:
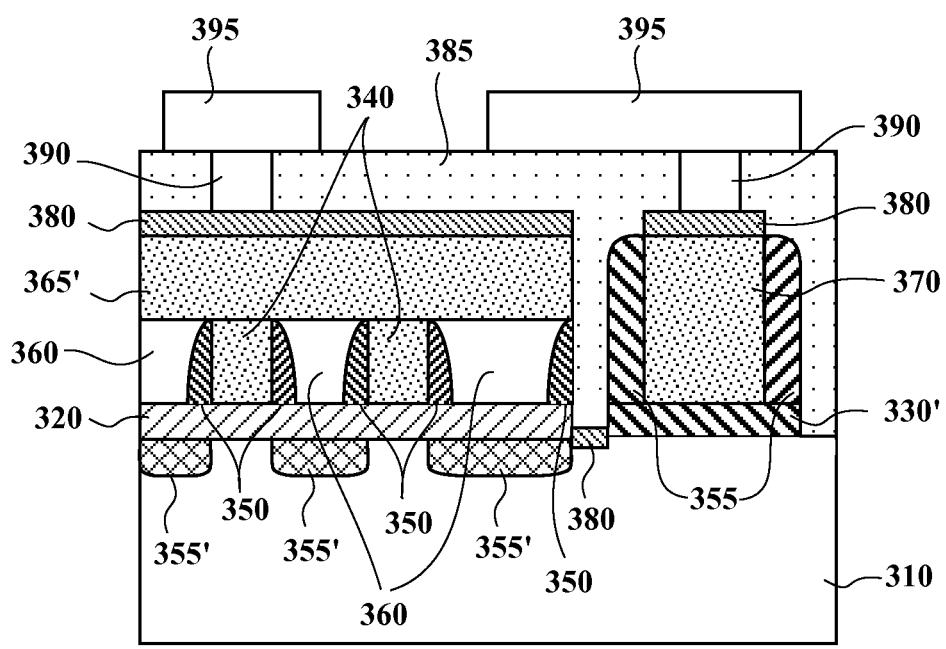

Referring to FIG. 3(g), an interlayer dielectric 385 is deposited over the silicide layers 380 such that the trenches 375 and 376 are filled. As shown, two contacts 390 are placed into the interlayer dielectric 385 after the interlayer dielectric 385 is patterned etched. Finally, two metal layers 395 are placed over the two contacts 390 on top of the interlayer dielectric 385. The two metal layers 395 are used as the conductive layers for the nitride read only memory devices and the periphery device. In one example, the two contacts can be tungsten, whereas the two metal layers can be aluminum.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A semiconductor device, comprising:
   a substrate having first and second diffusion regions therein;
   a dielectric layer defined over the substrate and the first and second diffusion regions;
   a first gate having a first polysilicon layer defined over and connecting a first portion of the dielectric layer between the first and second diffusion regions, the first gate having a first side and a second side, the first gate extending a length between the first and second diffusion regions such that each of the first side and the second side of the first gate is above an approximate interface of the first and second diffusion regions, wherein the first gate is at a memory region of the semiconductor device;
   first and second oxide regions positioned respectively beside the first side and the second side of the first gate and over the dielectric layer;
   a word line having a second portion of a second polysilicon layer over and connecting the first polysilicon layer of the first gate and the first and second oxide regions; and
   a second gate having the first polysilicon layer and a first portion of the second polysilicon layer, wherein the second gate is at a peripheral region of the semiconductor device.

2. The semiconductor device as recited in claim 1, further comprising:
   first and second insulator spacers positioned respectively beside the first side and the second side of the first gate, the first and second oxide regions positioned respectively beside the first and second insulator spacers.

3. The semiconductor device as recited in claim 2, wherein the second polysilicon layer is defined over the first gate, the first and second insulator spacers, and the first and second oxide regions.

4. The semiconductor device as recited in claim 1, further comprising a silicide layer on the first and second portions of the second polysilicon layer.

5. The semiconductor device as recited in claim 2, wherein each of the first and second insulator spacers is made of oxide.

6. The semiconductor device as recited in claim 1, wherein the first and second diffusion regions are defined as bit lines.

7. The semiconductor device as recited in claim 1, wherein the first and second diffusion regions are buried diffusion regions.

8. The semiconductor device as recited in claim 1, wherein the dielectric layer comprises an oxide-nitride-oxide (ONO) layer.

9. The semiconductor device as recited in claim 1, further comprising:
   a gate oxide layer between the second gate and the substrate, wherein the gate oxide layer comprises an oxide material and a second portion of the dielectric layer; and
   peripheral spacers at sidewalls of the second gate.

10. A semiconductor device, comprising:
    a non-volatile memory device comprising:
      first and second buried diffusion regions in a substrate;
      a dielectric layer defined over the substrate and the first and second buried diffusion regions;
      a first gate having a first polysilicon layer defined over and connecting a portion of the dielectric layer between the first and second buried diffusion regions;
      first and second oxide regions positioned respectively beside a first side and a second side of the first gate and over the dielectric layer; and
      a word line having a second portion of a second polysilicon layer over and connecting the first polysilicon layer of the first gate and the first and second oxide regions; and
    a peripheral device comprising a second gate having the first polysilicon layer and a first portion of the second polysilicon layer on the substrate.

11. The semiconductor device as recited in claim 10, wherein the first gate extends a length between the first and second buried diffusion regions such that each of the first side and the second side of the first gate is above an approximate interface of the first and second buried diffusion regions.

12. The semiconductor device as recited in claim 10, further comprising:
first and second insulator spacers positioned respectively beside the first side and the second side of the first gate, the first and second oxide regions being positioned respectively beside the first and second insulator spacers.

13. The semiconductor device as recited in claim 12, wherein the second polysilicon layer is defined over the first gate, the first and second insulator spacers, and the first and second oxide regions.

14. The semiconductor device as recited in claim 12, wherein each of the first and second insulator spacers is made of oxide.

15. The semiconductor device as recited in claim 10, wherein the second portion of the second polysilicon layer defines a word line.

16. The semiconductor device as recited in claim 10, wherein the first and second buried diffusion regions are defined as bit lines.

17. The semiconductor device as recited in claim 10, further comprising an interlayer dielectric layer between the non-volatile memory device and the peripheral device.

18. The semiconductor device as recited in claim 10, wherein the dielectric layer comprises an oxide-nitride-oxide (ONO) layer.

* * * * *